(12) United States Patent
Eckinger et al.

(10) Patent No.: US 9,978,930 B2
(45) Date of Patent: May 22, 2018

(54) METHOD FOR DOPING AN ACTIVE HALL EFFECT REGION OF A HALL EFFECT DEVICE

(71) Applicant: Infineon Technologies AG, Neubiberg (DE)

(72) Inventors: Markus Eckinger, Regenstauf (DE); Stefan Kolb, Unterschleissheim (DE)

(73) Assignee: Infineon Technologies AG, Neubiberg (DE)

(*) Notice: Subject to any disclaimer, the term of this patent is extended or adjusted under 35 U.S.C. 154(b) by 0 days. days.

(21) Appl. No.: 15/652,579

(22) Filed: Jul. 18, 2017

(65) Prior Publication Data

US 2017/0317271 A1 Nov. 2, 2017

Related U.S. Application Data

(63) Continuation of application No. 15/069,370, filed on Mar. 14, 2016, now Pat. No. 9,741,925.

(30) Foreign Application Priority Data

Mar. 13, 2015 (DE) .................. 10 2015 204 637

(51) Int. Cl.
| | |
|---|---|
| *H01L 43/04* | (2006.01) |
| *H01L 43/06* | (2006.01) |
| *H01L 33/00* | (2010.01) |
| *G01R 33/00* | (2006.01) |
| *G01R 33/07* | (2006.01) |
| *H01L 43/14* | (2006.01) |

(52) U.S. Cl.
CPC .......... *H01L 43/04* (2013.01); *G01R 33/0052* (2013.01); *G01R 33/07* (2013.01); *H01L 43/065* (2013.01); *H01L 43/14* (2013.01)

(58) Field of Classification Search
CPC ...................................................... H01L 43/04
See application file for complete search history.

(56) References Cited

U.S. PATENT DOCUMENTS

| | | | |
|---|---|---|---|
| 4,058,413 A | 11/1977 | Welch et al. | |
| 4,929,993 A | 5/1990 | Popovic | |
| 5,757,055 A * | 5/1998 | Kalb, Jr. ................ | G01R 33/06 257/421 |

(Continued)

OTHER PUBLICATIONS

Hara, et al., "Highly Linear GaAs Hall Devices Fabricated by Ion Implantation, IEEE Transaction on Electron Devices," vol. ED-29, No. 1, Jan. 1982, pp. 78-82.

*Primary Examiner* — Thao P Le
(74) *Attorney, Agent, or Firm* — Volpe and Koenig, P.C.

(57) ABSTRACT

Methods for doping an active Hall effect region of a Hall effect device in a semiconductor substrate, and Hall effect devices having a doped active Hall effect region are provided. A method includes forming a first doping profile of a first doping type in a first depth region of the active Hall effect region by means of a first implantation with a first implantation energy level, forming a second doping profile of the first doping type in a second depth region of the active Hall effect region by means of a second implantation with a second implantation energy level, and forming an overall doping profile of the active Hall effect region by annealing the semiconductor substrate with the active Hall effect region having the first and the second doping profile.

20 Claims, 7 Drawing Sheets

(56) References Cited

U.S. PATENT DOCUMENTS

| | | | |
|---|---|---|---|
| 5,883,518 A | 3/1999 | Borden | |
| 7,358,511 B2 | 4/2008 | Sasaki et al. | |
| 9,299,919 B1 | 3/2016 | Lee et al. | |
| 2005/0230770 A1 | 10/2005 | Oohira | |
| 2008/0142899 A1 | 6/2008 | Morris et al. | |
| 2012/0200290 A1* | 8/2012 | Ausserlechner | G01R 33/075 324/251 |
| 2012/0241887 A1 | 9/2012 | Schott et al. | |
| 2013/0021026 A1* | 1/2013 | Ausserlechner | G01L 1/12 324/251 |
| 2013/0307609 A1 | 11/2013 | Ausserlechner | |
| 2014/0009221 A1* | 1/2014 | Motz | G01R 33/0029 327/564 |
| 2015/0091112 A1* | 4/2015 | Kosier | G01R 33/077 257/427 |
| 2016/0056138 A1* | 2/2016 | Shibib | H01L 29/7815 257/48 |
| 2017/0317271 A1* | 11/2017 | Eckinger | G01R 33/0052 |

* cited by examiner

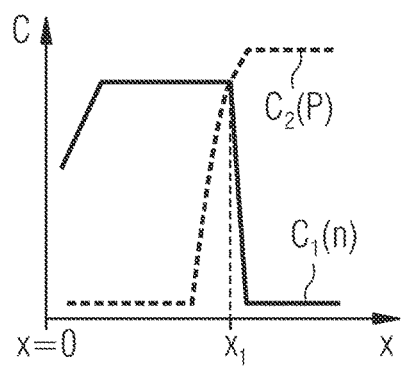
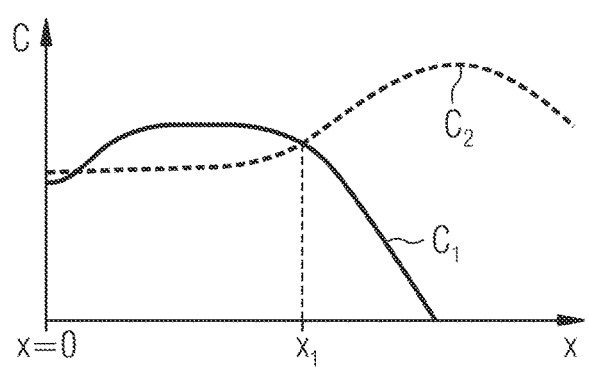
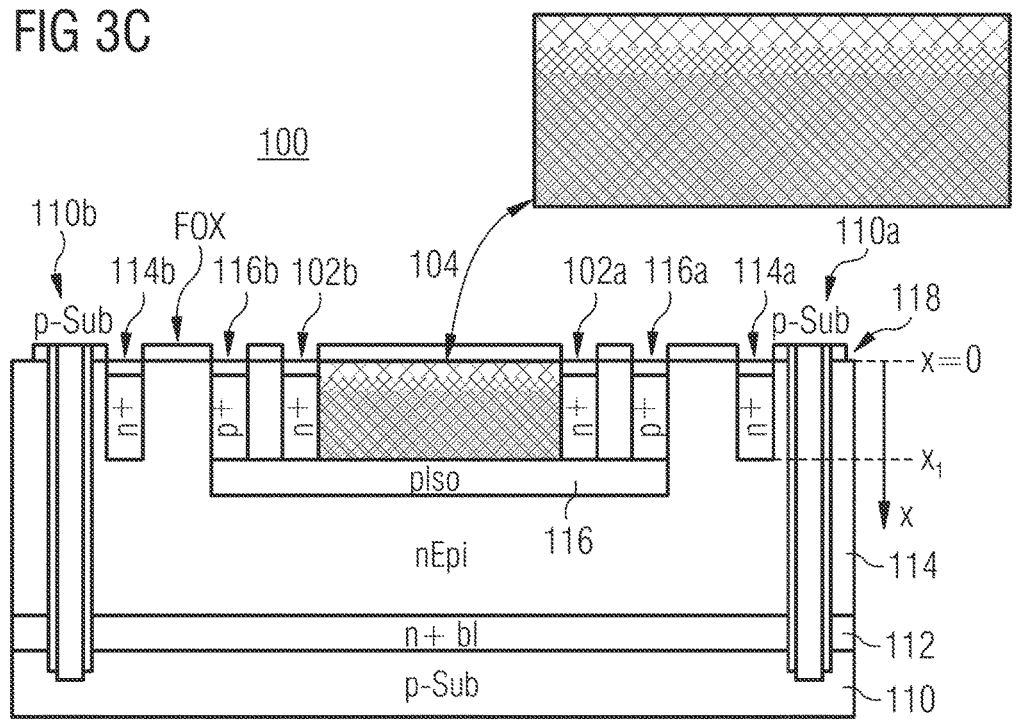

METHOD FOR DOPING AN ACTIVE HALL EFFECT REGION OF A HALL EFFECT DEVICE

CROSS REFERENCE TO RELATED APPLICATIONS

This application is a continuation of U.S. patent application Ser. No. 15/069,370, filed Mar. 14, 2016, which claims the benefit of German Patent Application No. 10 2015 204 637.0 filed Mar. 13, 2015, which are incorporated by reference as if fully set forth.

FIELD

The present disclosure relates to a method for doping an active Hall effect region of a Hall device in a semiconductor substrate, and to a Hall effect device having a doped active Hall effect region. In particular, the present disclosure relates to multi-implant options for lateral Hall effect devices.

BACKGROUND

Hall effect devices are magnetic field sensors that are adapted to sense a magnetic field based on the Hall effect. Lateral Hall effect devices sense a magnetic field component orthogonal to the surface of the semiconductor substrate, wherein vertical Hall effect devices sense a magnetic field component parallel to the surface of the semiconductor substrate containing the Hall effect device.

Moreover, Hall effect devices can be used for a variety of applications, such as proximity switching, positioning, speed detecting and current sensing applications. However, a drawback of Hall effect devices (Hall plates or Hall sensors) is their offset voltage, i.e., an output voltage at the same contacts in the absence of a magnetic field component acting on the active Hall effect region of the Hall effect device.

Therefore, improved Hall effect device having an increased magnetic sensitivity and a reduced signal-to-noise ratio (SNR) may be desirable.

SUMMARY

Exemplary embodiments provide a method for doping an active Hall effect region of a Hall effect device in a semiconductor substrate, the method comprising forming a first doping profile of a first doping type in a first depth region of the active Hall effect region by means of a first implantation with a first implantation energy level, forming a second doping profile of the first doping type in a second depth region of the active Hall effect region by means of a second implantation with a second implantation energy level, and forming an overall doping profile of the active Hall effect region by annealing the semiconductor substrate with the active Hall effect region having the first and second doping profile.

Exemplary embodiments further provide an Hall effect device having a doped active Hall effect region, wherein the doped active Hall effect region comprises a first doping profile of a first doping type in a first depth region, and a second doping profile of the first doping type in a second depth region of the doped active Hall effect region.

Exemplary embodiments further provide a Hall effect device manufactured by one or more methods for doping an active Hall effect region of a Hall effect device.

BRIEF DESCRIPTION OF THE DRAWINGS

Exemplary embodiments are described herein making reference to the appended drawings.

FIG. 3a shows a diagram of an ideal-theoretic course of the overall (multiple-implant) doping profile of the active Hall effect region according to one or more exemplary embodiments;

FIG. 3b shows a diagram of a simulated course of the overall (multiple-implant) doping profile of the active Hall effect region according to one or more exemplary embodiments FIG. 3c shows a schematic cross-sectional view of the doped active Hall effect region of the Hall effect device according to one or more exemplary embodiments;

Figure 1A:
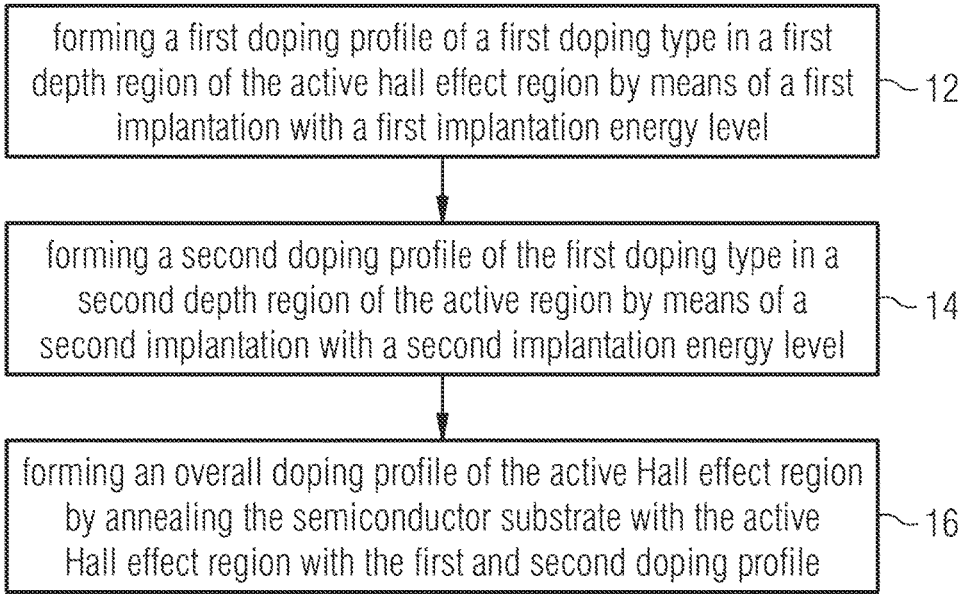
FIG. 1a shows a flowchart of a method for doping an active Hall effect region of a Hall effect device according to one or more exemplary embodiments.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers is omitted. Hence, descriptions provided for elements having the same or like reference numbers are mutually exchangeable.

DETAILED DESCRIPTION

In the following, a plurality of details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

In Hall effect devices (Hall sensors), the specific magnetic sensitivity is dependent on the mobility of the donors, i.e., the majority charge carriers, in the semiconductor material of the active Hall effect region. In case of an n-doping type of the semiconductor material, the majority charge carriers are electrons, wherein in case of a p-doping type of the semiconductor material, the majority charge carriers are holes.

As the specific magnetic sensitivity is dependent on the mobility of the donors, a low level of doping, i.e., a low doping concentration, leads to an increased mobility. At the same time, the magnetic sensitivity of a sensor element, i.e., the Hall effect device, is determined by the current impressed onto the sensor element, and thus by the applied voltage and the resulting resistance of the sensor element.

A combination of a low doping level (i.e., a low doping concentration of the active Hall region) and a low sheet resistance (film resistance) of the active Hall effect region can be achieved by reducing the average doping level and increasing the majority charge carrier mobility, and consequently improving the specific magnetic sensitivity of the (e.g., lateral) Hall effect device forming the sensor element, and by optimizing the sheet resistance for specific applications by simultaneously increasing the specific magnetic sensitivity and thus increasing the voltage-related magnetic sensitivity of the (lateral) Hall effect device. As a consequence, the signal-to-noise ratio of the Hall effect device can be improved.

An active Hall effect region of a (e.g., lateral) Hall effect device with improved physical and electrical characteristics can be achieved by forming an overall doping profile in the active Hall effect region by means of superimposing at least two doping profiles, e.g., a first and second doping profile, of a first doping type (of the majority charge carriers). Such an overall doping profile can be achieved by multiple implants (e.g., multiple implantations or ion implantations) in the semiconductor material of the active Hall effect region of the Hall effect device.

Thus, a homogeneous distribution of the dopant may be achieved by means of multiple implants. Thus, depending on the implant setting resulting in the overall doping profile as a superposition of at least two partial doping profiles, a low average doping level may be combined with a low sheet resistance. Thus, the resulting sensitivity and the signal-to-noise ratio of the resulting Hall effect device can be optimized. Based on the multiple implant doping profile, a region exhibiting an increased electro-mobility can be produced in a relative large subarea of the active Hall effect region. Moreover, noise effects resulting from near-surface doping profiles may be reduced, while the sensitive reaction of relatively deep implant profiles to back bias voltages can be effectively reduced.

To summarize, the utilization of multiple implants may allow for the production of optimized implant profiles in the active Hall effect region of Hall effect devices. To be more specific, based on the specific optimized overall doping profile in the active Hall region, important electrical characteristics such as the magnetic sensitivity, the signal-to-noise ratio, as well as the breakdown voltage VBD (latch-up effect) of the Hall effect device can be improved based on the respectively chosen overall doping profile in the active Hall effect region.

FIG. 1a shows a flowchart of a method 10 for doping an active Hall effect region of a (e.g., lateral) Hall effect device, wherein the active Hall effect region is formed in a semiconductor substrate. The method 10 comprises forming 12 a first doping profile of a first doping type in a first depth region of the active Hall effect region by means of a first implantation (e.g., an ion implementation) with a first implantation energy or dose level, and forming 14 a second doping profile of the first doping type in a second depth region of the active Hall effect region by means of a second implantation (e.g., a second ion implantation) with a second implantation energy or dose level, and forming 16 an overall doping profile of the active Hall effect region by annealing (the semiconductor substrate with) the active Hall effect region with the first and second (e.g., superimposed or overlaying) doping profiles.

According to one or more embodiments, the second doping profile may (at least) partially superimpose or overlay the first doping profile. Further, the first implantation energy level and the second implantation energy level may be different in order to achieve the first doping profile in the first depth region of the active Hall effect region which is different to the second doping profile in the second depth region of the active Hall effect region. The first doping profile and the second doping profile may be arranged in different depth regions in the active Hall effect region.

According to one or more embodiments, the first implantation energy level may have one of a first, second and third implantation dose rate, wherein the second implantation energy level may have one of the first, second and third implantation dose rate, wherein the first implantation dose rate is higher than the second implantation dose rate, and wherein the second implantation dose rate is higher than the third implantation dose rate.

The higher the implantation dose rate (implantation dose/energy) is, the deeper the respective depth region of the first or second doping profile of the first doping type is formed in the semiconductor substrate.

As the first implantation dose rate is higher than the second implantation dose rate, the first depth region is formed deeper in the semiconductor substrate (i.e., in a greater distance from the surface of the semiconductor substrate into the semiconductor material) than the second depth region. As the second implantation dose rate is higher than the third implantation dose rate, the second depth region is formed deeper in the semiconductor substrate (i.e., in a greater distance from the surface of the semiconductor substrate) than the third depth region.

Thus, the first depth region may extend to the isolation region 116 (i.e., to the np junction formed by the active Hall effect region and the isolation layer 116). Moreover, the third depth region may extend from the surface of the active Hall effect region (or a region adjacent to the surface of the active Hall effect region) into the substrate, wherein the second depth region may extend between the first and third depth regions. To summarize, based on the respective implantation dose rate (or implantation dose/energy), the distance of the respective depth region (i.e., of the first, second or third depth region) can be set to a desired value.

In the following, some exemplary values of the implantation dose/energy of the different implantations are given. For example, the first implantation dose rate may be equal to or greater than 400 keV (e.g., a high implantation dose rate), wherein the second implantation dose rate may be between 30 and 399 keV (e.g., a middle implantation dose rate), and wherein the third implantation dose rate is smaller than 100 keV (e.g., a low implantation dose rate).

In order to achieve the desired dopant concentration in the active Hall effect region of the Hall effect device, the different implantation steps for forming the different doping profiles may be performed in a repeated manner. To be more specific, in order to form the first doping profile of the first doping type in the first (relatively deep) depth region, the high implant step may be repeated, for example, more than six times.

In case the second implantation dose rate (middle implant) is used to form the partial doping profile of the first doping type in a middle depth region in the semiconductor material of the active Hall effect region, the implantation step may be performed in a repeated manner, for example, between three to six times.

In case a respective partial doping profile is formed with the third implantation dose rate (low implant) in a depth region relatively near or adjacent to the surface of the substrate material, the implantation step may be repeated once or twice, for example.

Based on the above described implantation steps, different doping profiles having different doping concentrations may be formed in different depth regions in the semiconductor material of the active Hall effect region. To summarize, the higher the chosen implantation dose rate is, the deeper the depth region of the respective doping profile is. The more often the implantation step is repeated, the higher the concentration of the resulting doping profile is in the associated depth region in the semiconductor material of the active Hall effect region.

As indicated above, the overall doping profile of the active Hall effect region is formed by annealing the semiconductor substrate with the active Hall effect region with the different superimposed partial doping profiles, i.e., with the first and second superimposed doping profiles.

The specific annealing time and temperature depends on the specific manufacturing technology of the respective Hall effect device.

In the case of an Rapid Thermal Processing (RTP), the annealing temperature may be in a range between 900 to 1200° C. for an annealing time of 1 second to 5 minutes, for example. In the case of diffusion processes, the annealing temperature may be within a range from 900 to 12000° C. for an annealing time of 5 minutes to 2 hours, for example.

It should be noted that the above values for the annealing time and annealing temperature are exemplary values.

In order to achieve a first doping profile which has a different extension in the semiconductor material of the active Hall effect region to the second doping profile, the first and second implantation energy level may be different. Thus, the first implantation energy level may be by a first factor of at least 1.5 times (e.g., 2, 5 or 10 times) higher than the second implantation energy level, and wherein the second energy implantation level may be by a second factor of at least 1.5 times (e.g., 2, 5 or 10 times) higher than the third implantation energy level.

In the following, typical doping concentrations for plateau regions and the minima and maxima regions of the different doping profiles of the first doping type in the semiconductor substrate of the first Hall effect region are described. The doping concentrations of highly doped regions and plateau regions may be up to approximately $10^{18}$ cm$^{-3}$ to $10^{20}$ cm$^{-3}$ (1E18 to 1E20 cm$^{-3}$), wherein a typical doping concentration for a minima region may be within a range from approximately $10^{14}$ cm$^{-3}$ to $10^{16}$ cm$^{-3}$ (1E14 to 1E16 cm$^{-3}$).

The active Hall effect region of the Hall effect device may be confined by an insulation region below the doped active Hall effect region in the semiconductor substrate. The isolation region (deep isolation implant region) may be provided by forming a doping profile of a second doping type in a fourth depth region in the semiconductor substrate below (the semiconductor material of) the active Hall region by means of a fourth implantation with a fourth implantation energy level, wherein the fourth depth region having the doping profile of the second doping type forms an isolation region (i.e., a deep isolation implant region) below the active Hall effect region and isolates the active Hall effect region from the remaining semiconductor substrate. The step of forming the doping profile of the second doping type may be performed before the steps of the different (first and second) doping profiles of the first doping type are performed.

Figure 1B:
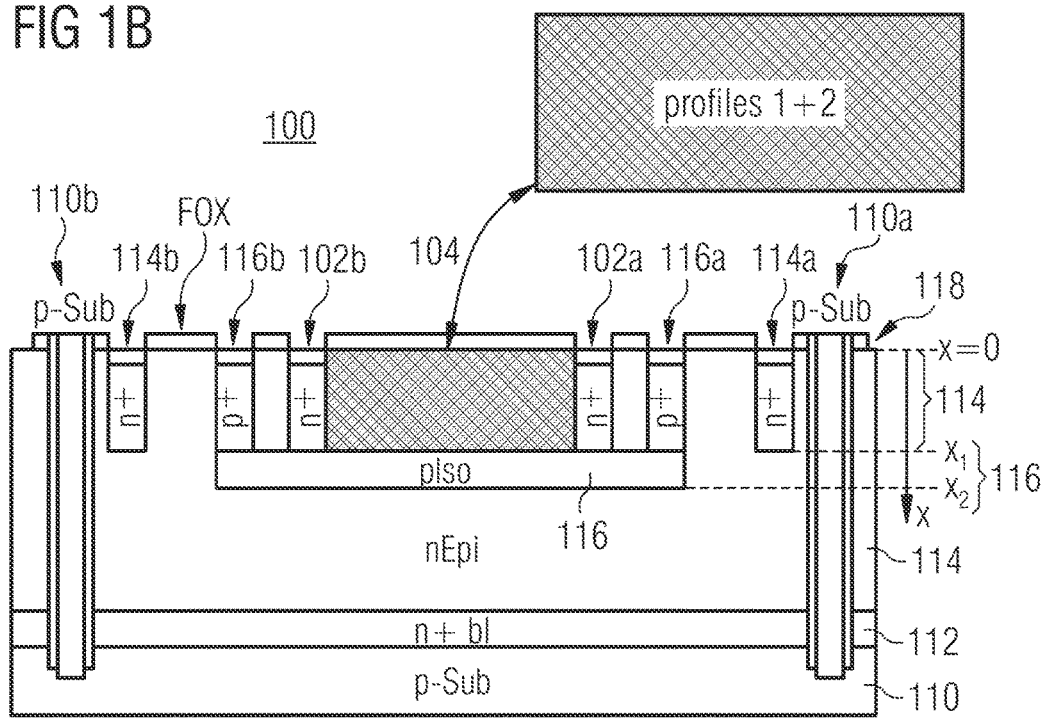
FIG. 1b shows a schematic cross-sectional view of an exemplary Hall effect device having the doped active Hall effect region according to one or more exemplary embodiments.

FIG. 1b shows a schematic cross sectional view of an exemplary Hall effect device having the doped active Hall effect region according to one or more exemplary embodiments.

Figure 2A:
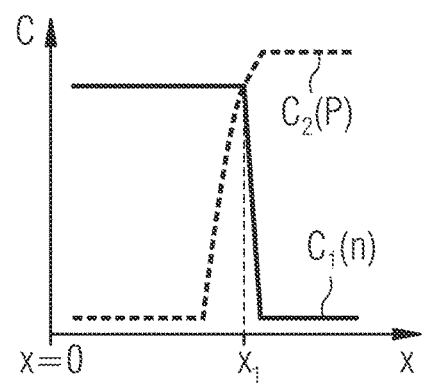
FIG. 2a shows a diagram of an ideal-theoretic course of the overall (multiple-implant) doping profile of the active Hall effect region according to one or more exemplary embodiments.
Figure 2B:
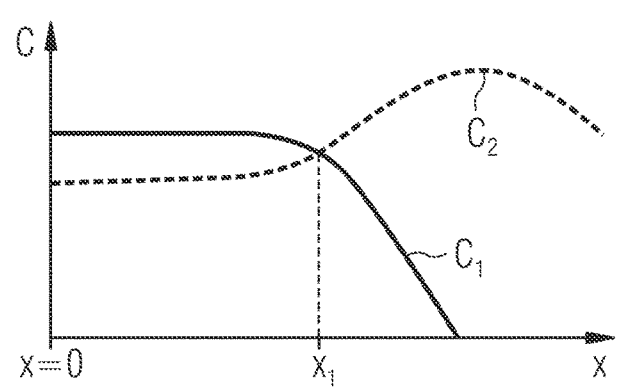
FIG. 2b shows a diagram of a simulated course of the overall (multiple-implant) doping profile of the active Hall effect region according to one or more exemplary embodiments.

In order to facilitate the description of the Hall effect device 100 in FIG. 2b, the Hall effect device 100 comprises the n-doping type as the first doping type and the p-doping type as the second doping type. However, it should be noted that the complementary doping types are also equally applicable.

As shown in the cross-sectional view of FIG. 1b, an n-epitaxy layer 114 is formed on a substrate, e.g., a p-substrate 110. Between the substrate 110 and the n-epitaxy layer 114, a buried n-layer, e.g., an n+ buried layer, 112 is arranged. The contact elements 102a, 102b (e.g., n+ contact elements) contact the active Hall effect region or Hall well 104 at opposite sides of the active Hall effect region 104 or extend in the active Hall effect region 104 on opposite sides thereof. The second pair of contact elements do not lie in the cross-sectional plane of FIG. 1b and are not shown.

Moreover, the n-epitaxy layer 114 may be at least partially covered by means of an isolation layer 118. The isolation layer 118 may comprise a field oxide (FOX)-material. In FIG. 1b, the p-isolation layer 116 (isolation region or deep isolation implant region) comprises contact elements 116a, 116b, e.g., p+ contact elements, for applying a biasing voltage to the p-isolation layer 116.

Moreover, the n-epitaxy layer 114 may comprise contact elements 114a, 114b for providing a biasing voltage to the n-epitaxy layer 114 for providing an electronic isolation of the active Hall effect region 10 in a lateral direction and a depth direction from the residual n-epitaxy layer 114. Moreover, FIG. 1b shows substrate contracts 110a, 110b in the form of isolated vias from the surface of the epitaxy layer 114 to the substrate 110. The conductive vias 110a, 110b may be isolated from the material of the n-epitaxy layer 114 and the n-layer 112 by means of an isolation material surrounding the conducting core.

The Hall effect device 100 of FIG. 1b is formed in the n-epitaxy layer 114. In other words, the active Hall effect region 104 in the form of an n-well is formed in or on the top of the n-epitaxy layer 114, wherein the n-epitaxy layer 114 (n-ep-layer) comprises an isolation arrangement 116 (p-iso-layer) to isolate the active Hall effect region 10 in a lateral direction and a depth direction from the n-epitaxy layer 114, the substrate 110, and/or other electronic devices in the substrate 110 or the n-epitaxy layer 114.

With respect to the above described Hall effect device 100, it should be noted that also complementary conductivity types, such as a p-type active Hall effect region 10, are equally applicable to the inventive concept.

As shown in FIG. 1b, the active Hall effect region 104 comprises the first and second profiles (profiles 1 and 2) which form together the overall doping profile C1 of the first doping type of the active Hall effect region 104. FIG. 1b also shows an enlarged cut-out of the active Hall effect region 104 for a more detailed illustration of the overall doping profile of the active Hall effect region 104.

The overall (multiple-implant) doping profile C extends from the substrate surface (x=0) into the semiconductor substrate and forms (in the range from x=0 to x1) the active Hall effect region 104 of the Hall effect device with the form of the doping concentration C1 of the first doping type (n), and forms (in the range x>x1 to x=x2) the insulation layer 116 with the doping concentration C2 of the second doping type (p), wherein C1=C2 at x1. The overall depth x1 of the active Hall effect region may be set to a value of about 1 µm or may be set to a value between 1 µm and 5 µm.

For the sake of simplicity, the active Hall effect region of a (lateral) Hall effect device can be regarded as a square plate with a constant thickness. Contacts are attached in the corners of this square plate, wherein a first pair of diagonally opposite contacts are combined with the primary side contacts, and wherein a second pair of diagonally opposite contacts are combined with the secondary side contacts. On the primary side, the Hall effect device is supplied with electrical energy by either a current source feeding a current or by a voltage source applying a voltage on the primary side. According to the Ohm's Law $U_H=R_H \times I_H$, the resistance $R_H$ is referred to as primary side resistance of the Hall effect device.

Since the sensitivity is linearly dependent on a first approximation of the Hall current $I_H$, the current related sensitivity $S_H=S/I_H$ is independent of the primary current. Thus, the current related sensitivity can be expressed as follows: $S_1=(r_n/qnt)*G$, where $r_n$ is the stray factor (spreading factor) of the majority charge carriers in the semiconductor material of the active Hall effect region, n is the density of the free charge carriers in the semiconductor material, t is the thickness of the Hall plate, G is a geometry factor and q is the elementary charge.

Alternatively, a voltage-related sensitivity of the Hall effect device can be defined as follows: $SU=S/UH=\mu_n$ (w/l) G with $\mu_n*=\mu_n r_n$, where $\mu_n*$ is the Hall mobility, which is the product of the mobility of the majority charge carriers (e.g., electrodes) $\mu_n$ and the stray factor $r_n$.

In the following, several forms and shapes of overall implantation profiles are described in detail that may be produced or formed by using the multiple implant steps (multiple ion implantations).

FIG. 2a shows a principle diagram of an ideal-theoretic course of the overall (multiple-implant) doping profile having the doping concentration C in the substrate with the active Hall effect region 104 of the Hall effect device in the form of the doping concentration C1 of the first doping type (n) and with the insulation layer 116 with the doping concentration C2 of the second doping type (p) in dependency on (or as function of) the distance x (or spacing) to the substrate surface (x=0).

FIG. 2b shows a principle diagram of a simulated course of the overall (multi-implant) doping profile in the in the substrate with the active Hall effect region 104 of the Hall effect device in the form of the doping concentration C1 of the first doping type (n) and the doping concentration C2 of the second doping type (p) in dependency on (or as function of) the distance x (or spacing) to the substrate surface (x=0).

Figure 2C:
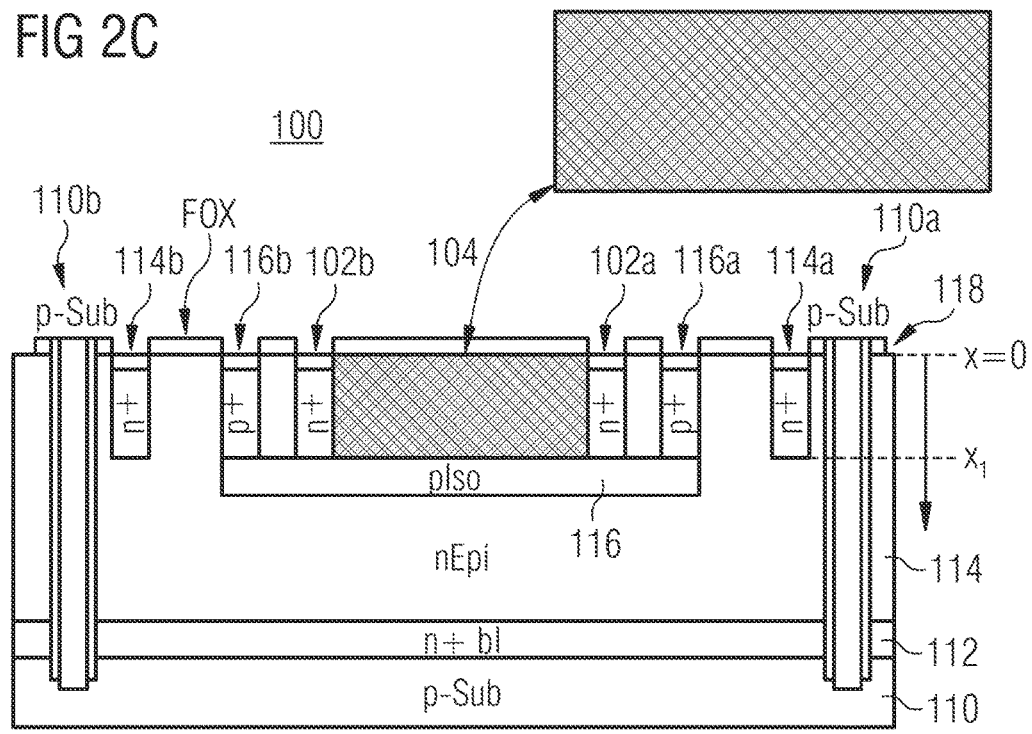
FIG. 2c shows a schematic cross-sectional view of the doped active Hall effect region of the Hall effect device according to one or more exemplary embodiments.

FIG. 2c shows a schematic cross-sectional view of the Hall effect device 100 having the doped active Hall effect region 104 according to one or more exemplary embodiments. FIG. 2c also shows an enlarged cut-out of the active Hall effect region 104 for a more detailed illustration of the overall doping profile of the active Hall effect region 104.

As indicated in FIGS. 2a and 2b, the active Hall effect region 104 may comprise an overall doping profile C1 with a "constant", nearly constant or substantially constant doping concentration in the entire area of the Hall well 104, i.e., in the active Hall effect region. Except for the specific overall doping profile of the active Hall effect region 104, the Hall effect device 100 corresponds to the Hall effect device 100 as explained in connection with FIG. 1b.

Within a tolerance range, the term "constant doping concentration" in the entire active Hall effect region means that, in an ideal case, the doping concentration of the first doping type is constant. However, due to non-ideal process steps (implantation steps) and non-ideal material characteristics (material distributions, lattice errors, etc.) of the semiconductor material, the term "constant within a tolerance range" means that the doping concentration may change with a factor of less than 2 (or 5 or 10) in the active Hall effect region. Due to so called edge effects, border regions of the active Hall effect region adjacent to the semiconductor surface or to the isolation region with a thickness of up to 50 nm may have a still larger tolerance range up to a factor of 10 (±one order of magnitude).

In order to provide the overall doping profile as shown in FIGS. 2a-c, the following steps for doping an active Hall effect region 104 of an (e.g., lateral) Hall effect device may be conducted. The active Hall effect region 104 is formed in a semiconductor substrate. The first doping profile of the first doping type may be formed in the first depth region of the active Hall effect region, wherein the first depth region extends to an isolation region 116 (deep isolation implant region) in the semiconductor substrate. A second doping profile of the first doping type is formed in the second depth region of the active Hall effect region. The second doping profile may partially superimpose at least the first doping profile. Further, a third doping profile of the first doping type is formed in a third depth region of the active Hall effect region, by means of a third implantation with a third implantation energy level. The third doping profile may partially superimpose at least the second doping profile.

Thus, the third depth region may extend from the surface of the active Hall effect region (or a region adjacent to the surface of the active Hall effect region) into the substrate, wherein the second depth region may extend between the first and third depth regions.

The first implantation energy level has a first implantation dose rate, wherein the second implantation energy level has a second implantation dose rate, and wherein the third implantation energy level has a third implantation dose rate. The first implantation dose rate is higher than the second implantation dose rate, wherein the second implantation dose rate is higher than the third implantation dose rate.

The first to third implantation dose rates are chosen to provide the resulting doping profile of the active Hall effect region having, within a tolerance range, a constant doping concentration of the first doping type in the depth direction from the surface of the semiconductor substrate and into the semiconductor substrate up to the (implanted) isolation layer of the second doping type.

The implanted isolation layer 116 of the second doping type may be formed by forming a doping profile of a second doping type in a fourth depth region in the semiconductor substrate below the active Hall effect region by means of a fourth (ion) implantation with a fourth implantation energy level, wherein the fourth depth region having the doping profile of the second doping type forms the isolation region 116 (deep isolation implant region) below the active Hall region. The isolation region may isolate the active Hall effect region 104 from the remaining semiconductor material. The step of forming the doping profile C2 of the second doping type may be performed before the steps of forming the first to third doping profile of the first doping type.

The overall doping profile C1 of the active Hall effect region 104 may be formed by annealing the active Hall effect region with the first, second and third doping profiles. The overall doping profile C2 may be formed by the same annealing step.

To summarize, in order to achieve, within a tolerance range, a constant doping concentration as the overall doping profile C1 of the first doping type in the entire active Hall effect region 104, and the overall doping profile C2 of the second doping type (at least partially) adjacent to the active Hall effect region 104, the following implantation steps (1)-(5) may be performed:

(1) A deep (high energy) isolation implantation for forming the isolation region 116 with the doping profile C2 (e.g., high implantation dose rate→p type), (2) A deep (high energy) implantation for the Hall effect region, (e.g., high implantation dose rate→n type), (3) An Implantation with middle energy for the active Hall effect region (e.g., middle implantation dose rate→n type), (4) An implantation with low energy (low implant) for the active Hall effect region (adjacent to the surface of the semiconductor substrate) (e.g., low implantation dose rate→n type), and (5) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

The achieved overall doping profile, which is (at least nearly or substantially) constant in the entire Hall effect region 104, may provide an improved magnetic sensitivity of the resulting Hall effect device 100.

FIG. 3a shows a principle diagram of an ideal-theoretic course of a further overall (multiple-implant) doping profile C in the substrate with the active Hall effect region 104 of the Hall effect device in the form of the doping concentration C1 of the first doping type (n) and the isolation layer 116 with the doping concentration C2 of the second doping type (p) in dependency on (or as function of) the distance x (or spacing) to the substrate surface (x=0).

FIG. 3b shows a principle diagram of a simulated course of a further overall (multi-implant) doping profile in the active Hall effect region 104 of the Hall effect device in the form of the doping concentration C in the substrate in the form of the doping concentration C1 of the first doping type (n) and the doping concentration C2 of the second doping type (p) in dependency on (or as function of) the distance x (or spacing) to the substrate surface (x=0).

FIG. 3c shows a schematic cross-sectional view of the Hall effect device 100 having a further doped active Hall effect region 104 according to one or more exemplary embodiments. FIG. 3c also shows an enlarged cut-out of the active Hall effect region 104 for a more detailed illustration of the overall doping profile of the active Hall effect region 104.

As indicated in FIGS. 3a and 3b, the active Hall effect region 104 may comprise an overall doping profile C1 with a reduced implant dose at the surface, followed by a constant dose of the Hall well up to the np junction. The achieved overall doping profile may provide an improvement in (magnetic) sensitivity and a reduction of noise.

Except for the specific overall doping profile of the active Hall effect region 104, the Hall effect device 100 corresponds to the Hall effect device 100 as explained in connection with FIG. 1b.

In order to provide the overall doping profile as shown in FIGS. 3a-c, the following steps for doping an active Hall effect region 104 of an (e.g., lateral) Hall effect device may be conducted. The active Hall effect region 104 is formed in a semiconductor substrate.

The first doping profile of the first doping type may be in a first depth region of the active Hall effect region, wherein the first depth region extends to the isolation region 116 in the semiconductor substrate. The second doping profile of the first doping type may be formed in a second depth region of the active Hall effect region, wherein the second depth region is spaced from the surface of the semiconductor substrate. The first implantation energy level has a first implantation dose rate, and the second implantation energy level has a second implantation dose rate, wherein the first implantation dose rate may be higher than second implantation dose rate. The second doping profile may partially superimpose the first doping profile.

The first to third implantation dose rates are selected to provide the resulting overall doping profile of the active Hall effect region having a doping concentration which increases from the surface of the substrate up to the middle of the second depth region of the active Hall effect region and has, within a tolerance range, a constant doping concentration of the first doping type from the middle of the second depth region through the first depth region up to the isolation region of the second doping type in the semiconductor substrate.

The overall doping profile C1 of the active Hall effect region 104 may be formed by annealing the active Hall effect region with the first, second and third doping profiles.

The implanted isolation layer 116 of the second doping type may be formed by forming a doping profile C2 of a second doping type in a fourth depth region in the semiconductor substrate below the active Hall effect region by means of a fourth (ion) implantation with a fourth implantation energy level, wherein the fourth depth region having the doping profile of the second doping type forms the isolation region 116 (deep isolation implant region) below the active Hall region. The isolation region may isolate the active Hall effect region 104 from the remaining semiconductor material. The step of forming the doping profile C2 of the second doping type may be performed before the steps of forming the first and second doping profile of the first doping type.

The overall doping profile C1 of the active Hall effect region 104 may be formed by annealing the active Hall effect region with the different doping profiles of the first doping type, wherein the overall doping profile C2 of a second doping type may be formed by the same annealing step, i.e., by annealing also the doping profile(s) of the second doping type.

To summarize, in order to achieve, within a tolerance range, the overall doping profile C1 of the first doping type with a reduced implant dose at the surface, followed by a constant dose of the Hall well up to the np junction, in the active Hall effect region 104, and the overall doping profile C2 of the second doping type (at least partially) adjacent to the active Hall effect region 104, the following implantation steps (1)-(4) may be performed:

(1) A deep (high energy) isolation implantation for forming the isolation region 116 with the doping profile C2 (e.g., high implantation dose rate→p type), (2) A deep (high energy) implantation for the Hall effect region, (e.g., high implantation dose rate→n type), (3) An Implantation with middle energy for the active Hall effect region (e.g., middle implantation dose rate→n type), (4) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

The achieved overall doping profile C1 with a reduced implant dose at the surface, followed by a constant dose of the Hall well up to the np junction may provide an improvement in (magnetic) sensitivity and a reduction of noise.

Figure 4A:
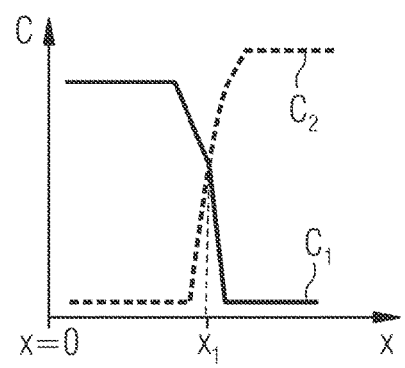
FIG. 4a shows a diagram of an ideal-theoretic course of the overall (multiple-implant) doping profile of the active Hall effect region according to one or more exemplary embodiments.

FIG. 4a shows a principle diagram of an ideal-theoretic course of a further overall (multiple-implant) doping profile C in the substrate with the active Hall effect region 104 of the Hall effect device in the form of the doping concentration C1 of the first doping type (n) and the isolation layer 116 with the doping concentration C2 of the second doping type (p) in dependency on (or as function of) the distance x (or spacing) to the substrate surface (x=0).

Figure 4B:
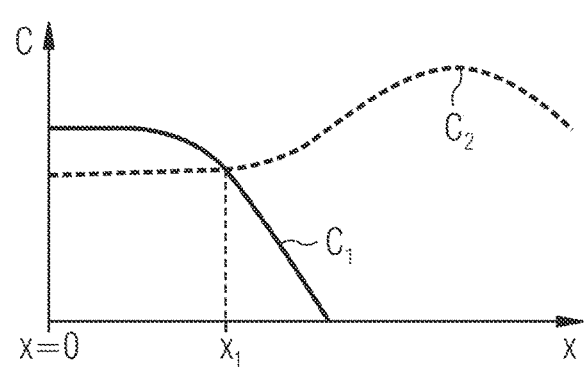
FIG. 4b shows a diagram of a simulated course of the overall (multiple-implant) doping profile of the active Hall effect region according to one or more exemplary embodiments.

FIG. 4b shows a principle diagram of a simulated course of a further overall (multi-implant) doping profile C in the substrate with the active Hall effect region 104 of the Hall effect device in the form of the doping concentration C1 of the first doping type (n) and the doping concentration C2 of the second doping type (p) in dependency on (or as function of) the distance x (or spacing) to the substrate surface (x=0).

Figure 4C:
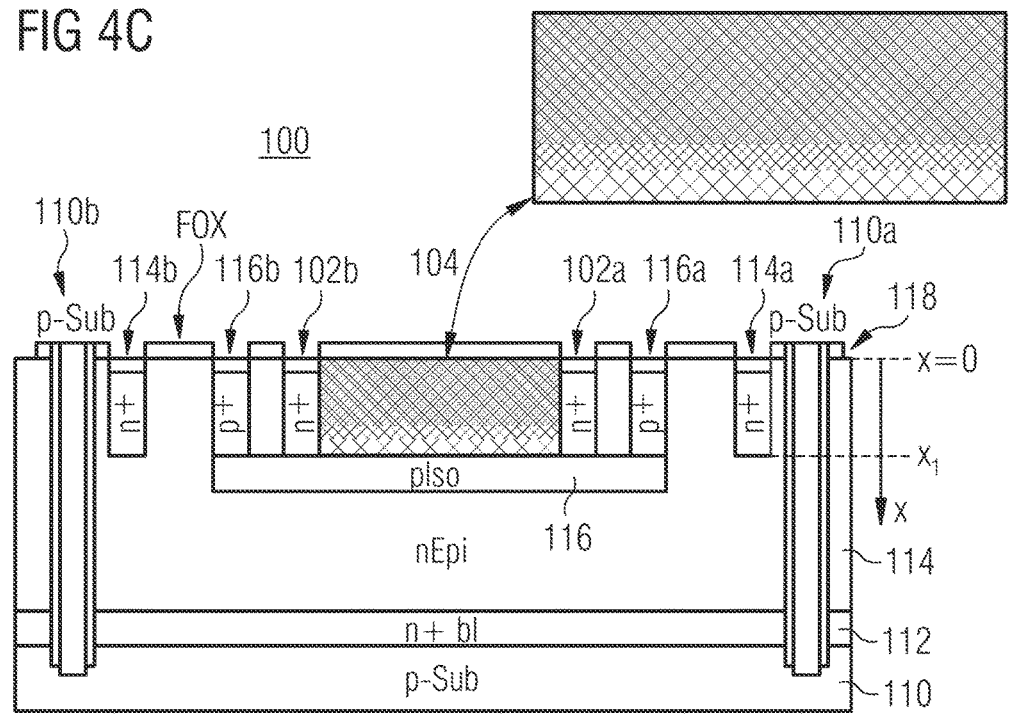
FIG. 4c shows a schematic cross-sectional view of the doped active Hall effect region of the Hall effect device according to one or more exemplary embodiments.

FIG. 4c shows a schematic cross-sectional view of the Hall effect device 100 having the doped active Hall effect region 104 according to one or more exemplary embodiments. FIG. 4c also shows an enlarged cut-out of the active Hall effect region 104 for a more detailed illustration of the overall doping profile of the active Hall effect region 104.

As indicated in FIGS. 4a and 4b, the active Hall effect region 104 may comprise an overall doping profile C1 with a constant dose of the Hall well starting from the surface, then a reduced dose shortly before the np junction. The achieved overall doping profile may provide an improvement in the (magnetic) sensitivity and may provide a high breakdown voltage VBD (latch-up).

Except for the specific overall doping profile of the active Hall effect region 104, the Hall effect device 100 corresponds to the Hall effect device 100 as explained in connection with FIG. 1b.

In order to provide the overall doping profile as shown in FIGS. 4a-c, the following steps for doping an active Hall effect region 104 of an (e.g., lateral) Hall effect device may be conducted. The active Hall effect region 104 is formed in a semiconductor substrate.

The first doping profile of the first doping type may be formed in a first depth region of the active Hall effect region, wherein the first depth region is spaced from an isolation region in the semiconductor substrate, and the second doping profile of the first doping type may be formed in a second depth region of the active Hall region adjacent to the surface of the semiconductor substrate, wherein the second depth region extends from the surface of the semiconductor substrate into the semiconductor substrate. The first implantation energy level has a first implantation dose rate, and the second implantation energy level has a second implantation dose rate, wherein the first implantation dose rate may be higher than second implantation dose rate.

The first and second implantation dose rates may be chosen to provide the overall doping profile of the active Hall effect region which has, within a tolerance range, a constant doping concentration of the first doping type from the surface of the substrate through the second depth region to the middle of the first depth region and decreases from the middle of the first depth region up to the isolation layer of the second doping type.

The implanted isolation layer 116 of the second doping type may be formed by forming a doping profile of a second doping type in a fourth depth region in the semiconductor substrate below the active Hall effect region by means of a fourth (ion) implantation with a fourth implantation energy level, wherein the fourth depth region having the doping profile of the second doping type forms the isolation region 116 (deep isolation implant region) below the active Hall region. The isolation region may isolate the active Hall effect region 104 from the remaining semiconductor material. The step of forming the doping profile of the second doping type may be performed before the steps of forming the first to third doping profile of the first doping type.

The overall doping profile C1 of the active Hall effect region 104 may be formed by annealing the active Hall effect region with the different doping profiles of the first doping type, wherein the overall doping profile C2 of a second doping type may be formed by the same annealing step, e.g., by annealing also the doping profile(s) of the second doping type.

To summarize, in order to achieve, the overall doping profile C1 of the first doping type in the active Hall effect region 104 with a constant dose of the Hall well starting from the surface, then a reduced dose shortly before the np junction, and the overall doping profile C2 of the second doping type (at least partially) adjacent to the active Hall effect region 104, the following implantation steps (1)-(4) may be performed:

(1) A deep (high energy) isolation implantation for forming the isolation region 116 with the doping profile C2 (e.g., high implantation dose rate→p type), (2) An Implantation with middle energy for the active Hall effect region (e.g., middle implantation dose rate→n type), (3) An implantation with low energy (low implant) for the active Hall effect region (adjacent to the surface of the semiconductor substrate) (e.g., low implantation dose rate→n type), and (4) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

The achieved overall doping profile may provide an improvement in the (magnetic) sensitivity and may provide a high breakdown voltage VBD (due to a latch-up).

Figure 5A:
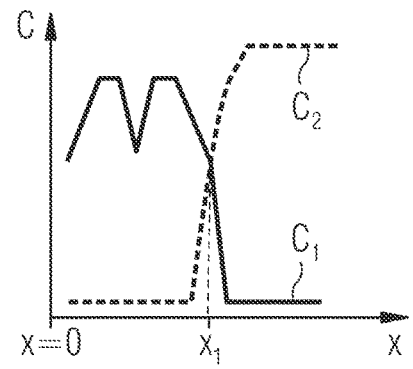
FIG. 5a shows a diagram of an ideal-theoretic course of the overall (multiple-implant) doping profile of the active Hall effect region to one or more exemplary embodiments.

FIG. 5a shows a principle diagram of an ideal-theoretic course of a further overall (multiple-implant) doping profile C in the active Hall effect region 104 of the Hall effect device in the form of the doping concentration C1 of the first doping type (n) and the doping concentration C2 of the second doping type (p) in dependency on (or as function of) the distance x (or spacing) to the substrate surface (x=0).

Figure 5B:
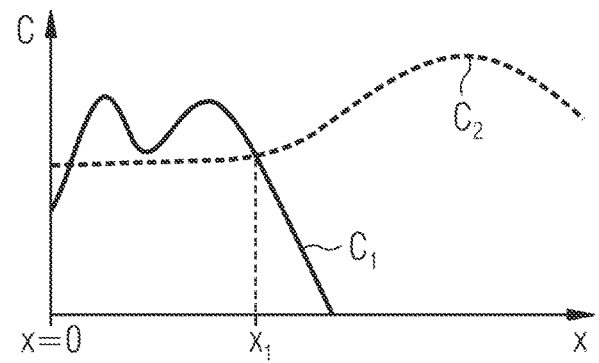
FIG. 5b shows a diagram of a simulated course of the overall (multiple-implant) doping profile of the active Hall effect region according to one or more exemplary embodiments.

FIG. 5b shows a principle diagram of a simulated course of a further overall (multi-implant) doping profile C in the substrate with the active Hall effect region 104 of the Hall effect device in the form of the doping concentration C1 of the first doping type (n) and the insolation layer 116 with the doping concentration C2 of the second doping type (p) in dependency on (or as function of) the distance x (or spacing) to the substrate surface (x=0).

Figure 5C:
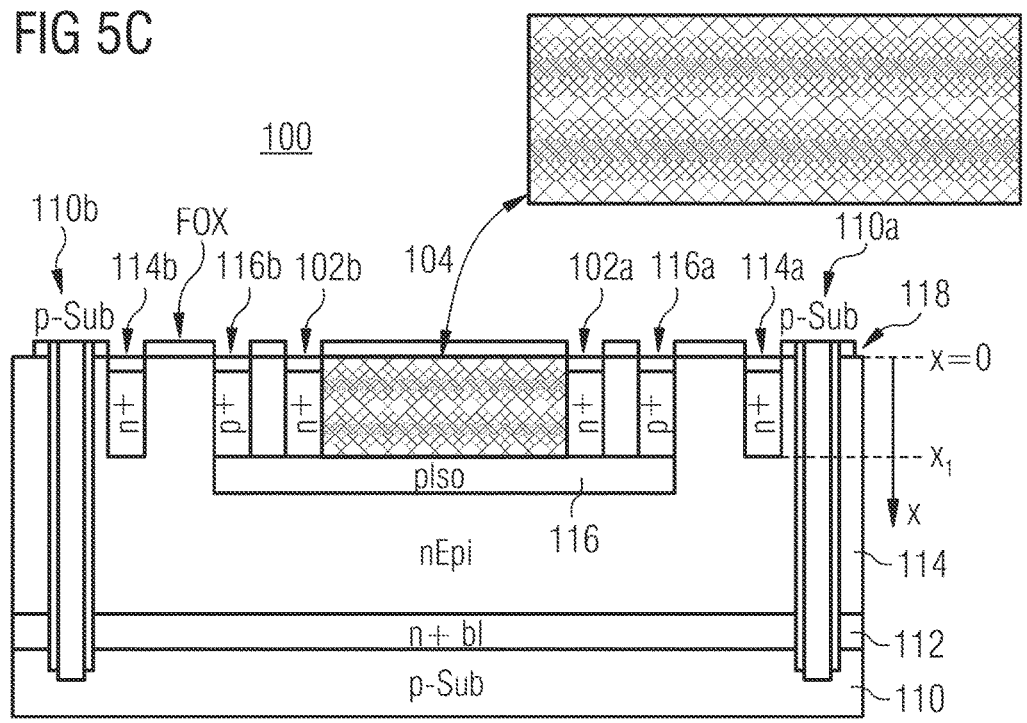
FIG. 5c shows a schematic cross-sectional view of the doped active Hall effect region of the Hall effect device according to one or more exemplary embodiments.

FIG. 5c shows a schematic cross-sectional view of the Hall effect device 100 having the doped active Hall effect region 104 according to one or more exemplary embodiments. FIG. 5c also shows an enlarged cut-out of the active Hall effect region 104 for a more detailed illustration of the overall doping profile of the active Hall effect region 104.

As indicated in FIGS. 5a and 5b, the active Hall effect region 104 may comprise an overall doping profile C1 with a reduced implant dose at the surface and at the center of the Hall well as well as in the depth before the np junction, and a constant dose in the areas between the reduced implants of the Hall well. The doping profile may provide a "stacked Hall effect region". The achieved overall doping profile may provide an improvement in the (magnetic) sensitivity, a reduction of noise and a high breakdown voltage $V_{BD}$ (latch-up) as a "stacked Hall region".

Except for the specific overall doping profile of the active Hall effect region 104, the Hall effect device 100 corresponds to the Hall effect device 100 as explained in connection with FIG. 1b.

In order to provide the overall doping profile as shown in FIGS. 5a-c, the following steps for doping an active Hall effect region 104 of an (e.g., lateral) Hall effect device may be conducted. The active Hall effect region 104 is formed in a semiconductor substrate.

The first doping profile of the first doping type may be in a first depth region of the active Hall effect region, wherein the first depth region is spaced from an isolation region in the semiconductor substrate, and the second doping profile of the first doping type may be in a second depth region of the active Hall effect region, wherein the second depth region is spaced form the surface of the semiconductor substrate. The first implantation energy level has a first implantation dose rate, and the second implantation energy level has a second implantation dose rate, wherein the first implantation dose rate may be higher than second implantation dose rate.

The implantation with the first implantation energy level may be repeated a plurality of times, wherein the implantation with the second implantation energy level may also be repeated a plurality of times.

The first and second implantation dose rates are chosen to provide the resulting doping profile of the active Hall effect region having a doping concentration which increases from the surface of the semiconductor substrate up to the middle of the second depth region of the active Hall effect region and reaches, within a tolerance range, a maximum doping concentration of the first doping type in the middle of the second depth region and decreases from the middle of the second depth region up to a middle region between the first and second depth region, and which increases from the a middle region between the first and second depth region to the middle of the first depth region and reaches, within a tolerance range, the maximum doping concentration of the first doping type in the middle of the first depth region and decreases from the middle of the second depth region up to the isolation layer of the second doping type.

In other words, the resulting active Hall effect region may comprise an overall doping profile C1 with a reduced (low) implant dose of the Hall well within depth regions at the surface, the center area and shortly before the np junction (i.e., in the depth before the np junction) of the active Hall effect region, and an increased (higher) implant dose in depth regions in the middle between the increased implant dose at the surface and the center area, and in the middle between the increased implant dose at the center area and the depth area before the np junction of the Hall well. The achieved overall doping profile may provide an improvement in the (magnetic) sensitivity, a reduction of noise and a high breakdown voltage $V_{BD}$ (latch-up) as a "stacked Hall region".

The implanted isolation layer 116 of the second doping type may be formed by forming a doping profile of a second doping type in a fourth depth region in the semiconductor substrate below the active Hall effect region by means of a fourth (ion) implantation with a fourth implantation energy level, wherein the fourth depth region having the doping profile of the second doping type forms the isolation region 116 (deep isolation implant region) below the active Hall region. The isolation region may isolate the active Hall effect region 104 from the remaining semiconductor material. The step of forming the doping profile of the second doping type may be performed before the steps of forming the first to third doping profile of the first doping type.

The overall doping profile C1 of the active Hall effect region 104 may be formed by annealing the active Hall effect region with the different doping profiles of the first doping type, wherein the overall doping profile C2 of a second doping type may be formed by the same annealing step, i.e., by annealing also the doping profile(s) of the second doping type.

To summarize, in order to achieve, within a tolerance range, the overall doping profile C1 of the first doping type in the active Hall effect region 104 with a reduced implant dose at the surface and at the center of the Hall well as well as in the depth before the np junction, and a constant dose in the areas between the reduced implants of the Hall well, and the overall doping profile C2 of the second doping type (at least partially) adjacent to the active Hall effect region 104, the following implantation steps (1)-(4) may be performed:

(1) A deep (high energy) isolation implantation for forming the isolation region 116 with the doping profile C2 (e.g., high implantation dose rate→p type), (2) One or a plurality of implantations (implant steps) with middle energy for the active Hall effect region (e.g., middle implantation dose rate→n type), (3) One or a plurality of implantations (implant steps) with implant steps with high energy) for the Hall effect region, (e.g., high implantation dose rate→n type), (4) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

The achieved overall doping profile may provide a resulting Hall effect device 100 with an improved (magnetic) sensitivity, a reduction of noise and a high breakdown voltage $V_{BD}$ (latch-up) as a "stacked Hall effect region".

A further optional variation (not shown in the figures) of the doped active Hall effect regions 104 with respect to a "stacked" doping profile may be implemented as follows. The different (e.g., first, second and/or third etc.) implantation dose rates are chosen to provide the resulting doping profile of the active Hall effect region which has, within a tolerance range, an alternating sequence of depth areas with an reduced (low) implant dose and an increased (high) implant dose, the different (alternating) depth region extend from the surface region (having a low implant dose) to the depth region (having a low implant dose) shortly before the np junction of the active Hall effect region.

Figure 6A:
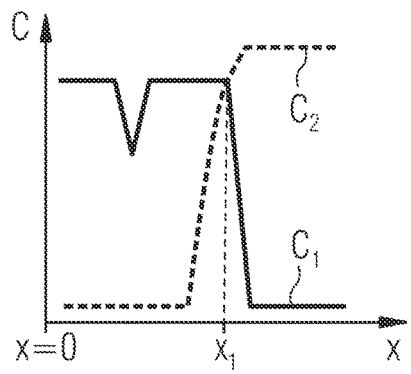
FIG. 6a shows a diagram of an ideal-theoretic course of the overall (multiple-implant) doping profile of the active Hall effect region according to one or more exemplary embodiments.

FIG. 6a shows a principle diagram of an ideal-theoretic course of a further overall (multiple-implant) doping profile C in the active Hall effect region 104 of the Hall effect device in the form of the doping concentration C1 of the first doping type (n) and the doping concentration C2 of the second doping type (p) in dependency on (or as function of) the distance x (or spacing) to the substrate surface (x=0).

Figure 6B:
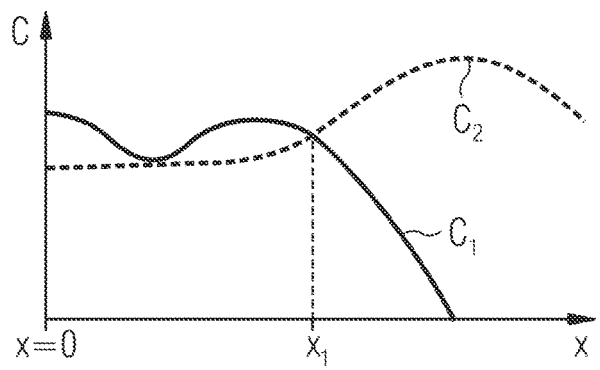
FIG. 6b shows a diagram of a simulated course of the overall (multiple-implant) doping profile of the active Hall effect region according to one or more exemplary embodiments.

FIG. 6b shows a principle diagram of an simulated course of a further overall (multi-implant) doping profile in the substrate with the active Hall effect region 104 of the Hall effect device in the form of the doping concentration C1 of the first doping type (n) and the insulation layer 116 with the doping concentration C2 of the second doping type (p) in dependency on (or as function of) the distance x (or spacing) to the substrate surface (x=0).

Figure 6C:
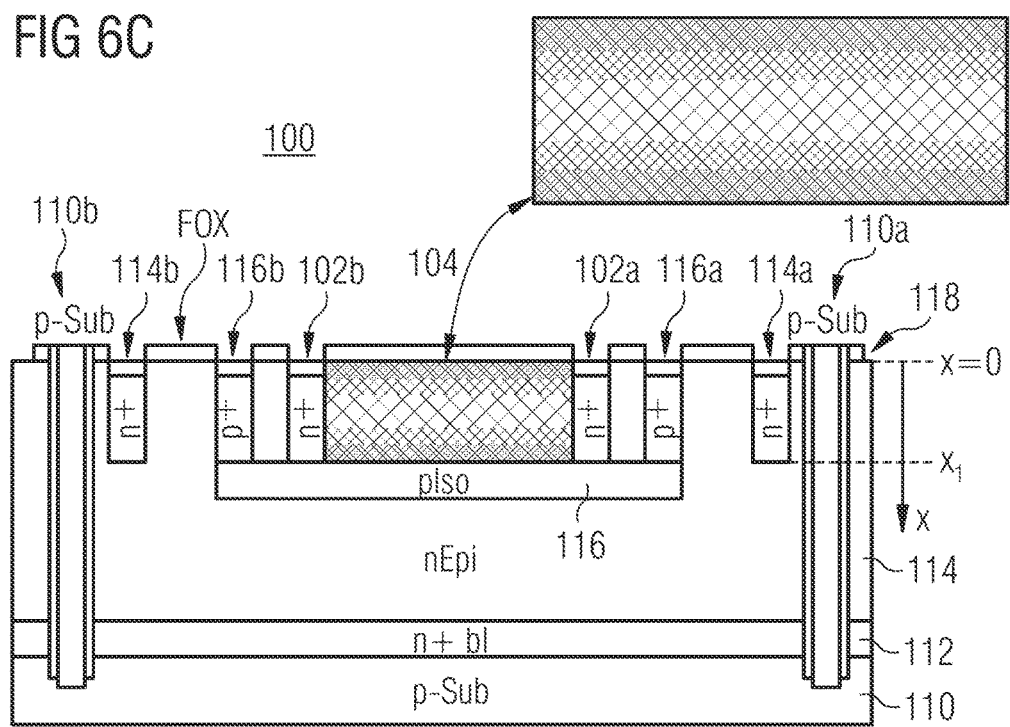
FIG. 6c shows a schematic cross-sectional view of the doped active Hall effect region of the Hall effect device according to one or more exemplary embodiments.

FIG. 6c shows a schematic cross-sectional view of the Hall effect device 100 having the doped active Hall effect region 104 according to one or more exemplary embodiments. FIG. 6c also shows an enlarged cut-out of the active Hall effect region 104 for a more detailed illustration of the overall doping profile of the active Hall effect region 104.

As indicated in FIGS. 6a and 6b, the active Hall effect region 104 may comprise an overall doping profile C1 with a (at least nearly) constant dose of the Hall well at the surface and shortly before the np junction, and a reduced dose at the center of the Hall well. The achieved overall doping profile may provide an improvement in the (magnetic) sensitivity as a "stacked Hall region".

Except for the specific overall doping profile of the active Hall effect region 104, the Hall effect device 100 corresponds to the Hall effect device 100 as explained in connection with FIG. 1b.

Within a tolerance range, the term "constant doping concentration" in the active Hall effect region means that in an ideal case, the doping concentration of the first doping type is constant. However, due to non-ideal process steps (implantation steps) and non-ideal material characteristics (material distributions, lattice errors, etc.) of the semiconductor material, the term "constant within a tolerance range" means in connection with the inventive concept that the doping concentration may change with a factor of less than 2 (or 5 or 10) in the active Hall effect region. Due to so called edge effects, border regions of the active Hall effect region adjacent to the semiconductor surface or to the isolation region with a thickness of up to 50 nm may have a still larger tolerance range up to a factor of 10 (±one order of magnitude).

In order to provide the overall doping profile as shown in FIGS. 6a-c, the following steps for doping an active Hall effect region 104 of an (e.g., lateral) Hall effect device may be conducted. The active Hall effect region 104 is formed in a semiconductor substrate.

The first doping profile of the first doping type may be formed in a first depth region of the active Hall effect region up to an implanted isolation region in the semiconductor substrate, and the second doping profile of the first doping type may be formed in a second depth region of the active Hall effect region adjacent to the surface of the semiconductor substrate. The first implantation energy level has a first implantation dose rate, and the second implantation energy level has a second implantation dose rate, wherein the first implantation dose rate may be higher than second implantation dose rate.

The implantation with the first implantation energy level may be repeated a plurality of times, wherein the implantation with the second implantation energy level may also be repeated a plurality of times.

The first and second implantation dose rates are chosen to provide the resulting doping profile of the active Hall effect region which has, within a tolerance range, a constant doping concentration of the first doping type from the surface of the semiconductor substrate to the middle of the second depth region and decreases from the middle of the second depth region up to a middle region between the first and second depth region to a local minimum of the doping concentration, and wherein the resulting doping profile of the active Hall effect region has a doping concentration which increases from the middle region between the first and second depth region to the middle of the first depth region and reaches, within a tolerance range, the constant doping concentration of the first doping type in the middle of the first depth region and up to the implanted isolation layer of the second doping type.

The implanted isolation layer 116 of the second doping type may be formed by forming a doping profile of a second doping type in a fourth depth region in the semiconductor substrate below the active Hall effect region by means of a fourth (ion) implantation with a fourth implantation energy level, wherein the fourth depth region having the doping profile of the second doping type forms the isolation region 116 (deep isolation implant region) below the active Hall region. The isolation region may isolate the active Hall effect region 104 from the remaining semiconductor material. The step of forming the doping profile of the second doping type may be performed before the steps of forming the first and second doping profile of the first doping type.

The overall doping profile C1 of the active Hall effect region 104 may be formed by annealing the active Hall effect region with the different doping profiles of the first doping type, wherein the overall doping profile C2 of a second doping type may be formed by the same annealing step, i.e., by annealing also the doping profile(s) of the second doping type.

To summarize, in order to achieve an overall doping profile C1 of the first doping type with a (at least nearly) constant dose of the Hall well at the surface and shortly before the np junction, and a reduced dose at the center of the Hall well (i.e., in the active Hall effect region 104), and the overall doping profile C2 of the second doping type (at least partially) adjacent to the active Hall effect region 104, the following implantation steps (1)-(4) may be performed:

(1) A deep (high energy) isolation implantation for forming the isolation region 116 with the doping profile C2 (e.g., high implantation dose rate→p type), (2) One or a plurality of deep implantations (implant steps with high energy) for the Hall effect region, (e.g., high implantation dose rate→n type), (3) One or a plurality of implantations (implant steps) with low(er) energy (low implant) for the active Hall effect region (adjacent to the surface of the semiconductor substrate) (e.g., low implantation dose rate→n type), and (4) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

The achieved overall doping profile may provide an improvement in the (magnetic) sensitivity as a "stacked Hall region".

Figure 7A:
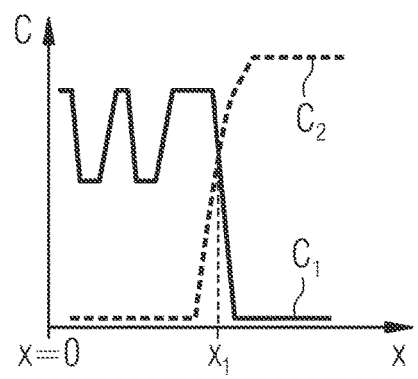
FIG. 7a shows a diagram of an ideal-theoretic course of the overall (multiple-implant) doping profile of the active Hall effect region according to one or more exemplary embodiments.

FIG. 7a shows a principle diagram of an ideal-theoretic course of a further overall (multiple-implant) doping profile C in the substrate with the active Hall effect region 104 of the Hall effect device in the form of the doping concentration C1 of the first doping type (n) and the isolation layer with the doping concentration C2 of the second doping type (p) in dependency on (or as function of) the distance x (or spacing) to the substrate surface (x=0).

Except for the specific overall doping profile of the active Hall effect region 104, the Hall effect device 100 corresponds to the Hall effect device 100 as explained in connection with FIG. 1b.

Figure 7B:
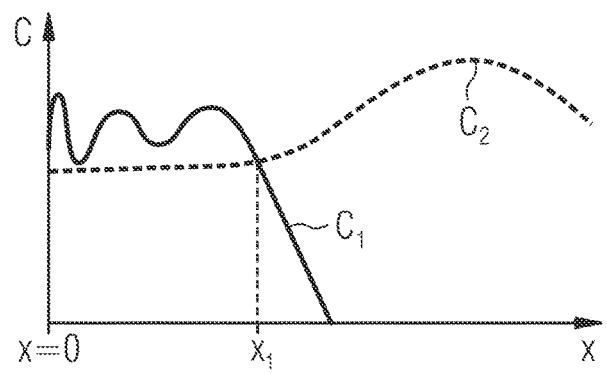
FIG. 7b shows a diagram of a simulated course of the overall (multiple-implant) doping profile of the active Hall effect region according to one or more exemplary embodiments.

FIG. 7b shows a principle diagram of a simulated course of a further overall (multi-implant) doping profile in the active Hall effect region 104 of the Hall effect device in the form of the doping concentration C in the active Hall effect region 104 of the Hall effect device in the form of the doping concentration C1 of the first doping type (n) and the doping concentration C2 of the second doping type (p) in dependency on (or as function of) the distance x (or spacing) to the substrate surface (x=0).

Figure 7C:
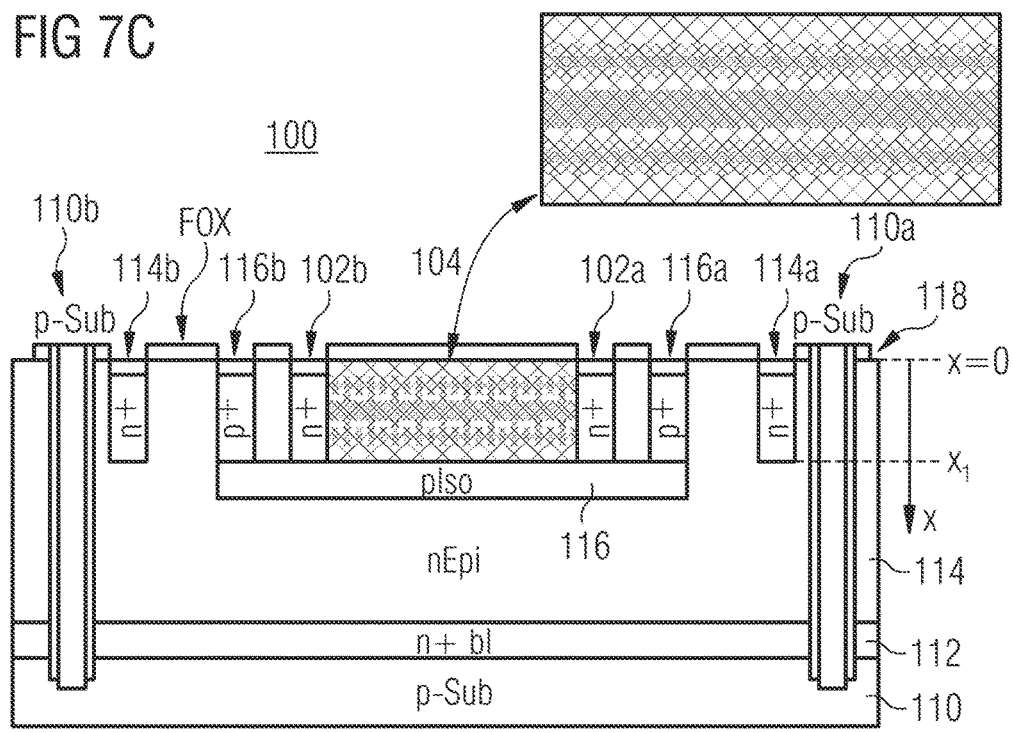
FIG. 7c shows a schematic cross-sectional view of the doped active Hall effect region of the Hall effect device according to one or more exemplary embodiments.

FIG. 7c shows a schematic cross-sectional view of the Hall effect device 100 having the doped active Hall effect region 104 according to one or more exemplary embodiments. FIG. 7c also shows an enlarged cut-out of the active Hall effect region 104 for a more detailed illustration of the overall doping profile of the active Hall effect region 104.

Except for the specific overall doping profile of the active Hall effect region 104, the Hall effect device 100 corresponds to the Hall effect device 100 as explained in connection with FIG. 1b.

FIGS. 7a-c show an optional variation of the doped active Hall effect regions 104, as shown above in FIGS. 5a-c and 6a-c, with a "stacked" doping profile.

The different (e.g., first, second and/or third etc.) implantation dose rates are chosen to provide the resulting doping profile of the active Hall effect region which has, within a tolerance range, an alternating sequence of depth areas with an increased (high) implant dose and a reduced (lower) implant dose, the different (alternating) depth region extend from the surface region (having a high implant dose) to the depth region (having a high implant dose) shortly before the np junction of the active Hall effect region. The implantations with the different implantation energy levels may be repeated a plurality of times, respectively.

As indicated in FIGS. 7a and 7b, the active Hall effect region 104 may comprise an overall doping profile C1 with an increased (high) implant dose of the Hall well within depth regions at the surface, the center area and shortly before the np junction (i.e., in the depth before the np junction) of the active Hall effect region, and a reduced (low) implant dose in depth regions in the middle between the increased implant dose at the surface and the center area, and in the middle between the increased implant dose at the center area and the depth area before the np junction of the Hall well. The achieved overall doping profile may provide an improvement in the (magnetic) sensitivity, a reduction of noise and a high breakdown voltage $V_{BD}$ (latch-up) as a "stacked Hall region".

To summarize, in order to achieve a "stacked" overall doping profile C1 in the active Hall effect region 104, and the overall doping profile C2 of the second doping type (at least partially) adjacent to the active Hall effect region 104, the following implantation steps (1)-(4) may be performed:

(1) A deep (high energy) isolation implantation for forming the isolation region 116 with the doping profile C2 (e.g., high implantation dose rate→p type), (2) One or a plurality of deep implantations (implant steps with high energy) for the Hall effect region, (e.g., high implantation dose rate→n type), (3) One or a plurality of implantations (implant steps) with low(er) energy (low implant) for the active Hall effect region (adjacent to the surface of the semiconductor substrate) (e.g., low implantation dose rate→n type), and (4) Annealing the semiconductor material wherein the steepness of the edges/flanks of the profiles may be adjusted by means of the annealing temperature and annealing time (RTP/oven) for achieving the resulting overall doping profile C1 of the first doping type (e.g., n type) and the resulting overall doping profile C2 of the second doping type (e.g., p type).

Additional exemplary embodiments are provided below.

Embodiments

1. A method for doping an active Hall effect region of a Hall effect device in a semiconductor substrate, the method comprising:

forming a first doping profile of a first doping type in a first depth region of the active Hall effect region by means of a first implantation with a first implantation energy level, forming a second doping profile of the first doping type in a second depth region of the active Hall effect region by means of a second implantation with a second implantation energy level, and forming an overall doping profile of the active Hall effect region by annealing the semiconductor substrate with the active Hall effect region having the first and second doping profile.

2. The method according to embodiment 1, wherein the second doping profile partially superimposes the first doping profile.

3. The method according to embodiment 1 or 2, wherein the first implantation energy level and second implantation energy level are different, and wherein the first implantation energy level has one of a first, second and third implantation dose rate, and wherein the second implantation energy level has one of the first, second and third implantation dose rate, wherein the first implantation dose rate is higher than second implantation dose rate, wherein the second implantation dose rate is higher than third implantation dose rate.

4. The method according to embodiment 3, wherein the first implantation energy level is by a first factor of at least 1.5 higher than the second implantation energy level, and wherein the second energy implantation level is by a second factor of at least 1.5 higher than the third implantation energy level.

5. The method according to any of the preceding embodiments, the method further comprising:
forming a doping profile of a second doping type in a fourth depth region in the semiconductor substrate below the active Hall effect region by means of a fourth implantation with a fourth implantation energy level, wherein the fourth depth region having the doping profile of the second doping type forms an isolation region below the active Hall effect region, wherein the step of forming the doping profile of the second doping type is performed before the steps of forming the first and second doping profile of the first doping type.

6. The method according to any of embodiments 1 to 5, comprising:
forming the first doping profile of the first doping type in the first depth region of the active Hall effect region, wherein the first depth region extends to an isolation region in the semiconductor substrate,
forming the second doping profile of the first doping type in the second depth region of the active Hall effect region, wherein the second doping profile partially superimposes at least the first doping profile,
forming a third doping profile of the first doping type in a third depth region of the active Hall effect region, by means of a third implantation with a third implantation energy level, wherein the third doping profile partially superimposes at least the second doping profile, wherein the first depth region extends from a surface of the semiconductor substrate into the semiconductor substrate, and
forming the overall doping profile of the active Hall effect region by annealing the active Hall effect region with the first, second and third doping profiles.

7. The method according to embodiment 6, wherein the first implantation energy level has a first implantation dose rate, wherein the second implantation energy level has a second implantation dose rate, and wherein the third implantation energy level has a third implantation dose rate,
wherein the first implantation dose rate is higher than second implantation dose rate, wherein the second implantation dose rate is higher than third implantation dose rate.

8. The method according to embodiment 7, wherein the first to third implantation dose rates are chosen to provide the overall doping profile of the active Hall effect region having, within a tolerance range, a constant doping concentration of the first doping type in the depth direction from the surface of the semiconductor substrate into the semiconductor substrate up to the isolation layer of the second doping type.

9. The method according to embodiment 1, comprising:
forming the first doping profile of the first doping type in the first depth region of the active Hall effect region, wherein the first depth region extends to an isolation region in the semiconductor substrate, and
forming the second doping profile of the first doping type in a second depth region of the active Hall effect region, wherein the second depth region is spaced from the surface of the semiconductor substrate,
wherein the first implantation energy level has a first implantation dose rate, and the second implantation energy level has a second implantation dose rate, wherein the first implantation dose rate is higher than second implantation dose rate.

10. The method according to embodiment 9, wherein the first and second implantation dose rates are chosen to provide the overall doping profile of the active Hall effect region having a doping concentration which increases from the surface of the substrate up to the middle of the second depth region of the active Hall effect region and has, within a tolerance range, a constant doping concentration of the first doping type from the middle of the second depth region through the first depth region up to the isolation region of the second doping type in the semiconductor substrate.

11. The method according to embodiment 1, comprising:
forming the first doping profile of the first doping type in the first depth region of the active Hall effect region, wherein the first depth region is spaced from an isolation region in the semiconductor substrate, and
forming the second doping profile of the first doping type in a second depth region of the active Hall region adjacent to the surface of the semiconductor substrate, wherein the second depth region extends from the surface of the semiconductor substrate into the semiconductor substrate;
wherein the first implantation energy level has a first implantation dose rate, and the second implantation energy level has a second implantation dose rate, wherein the first implantation dose rate is higher than second implantation dose rate.

12. The method according to embodiment 11, wherein the first and second implantation dose rates are chosen to provide the overall doping profile of the active Hall effect region which has, within a tolerance range, a constant doping concentration of the first doping type from the surface of the substrate through the second depth region to the middle of the first depth region and decreases from the middle of the first depth region up to the isolation layer of the second doping type.

13. The method according to embodiment 1, comprising:
forming the first doping profile of the first doping type in the first depth region of the active Hall effect region, wherein the first depth region is spaced from an isolation region in the semiconductor substrate, and
forming the second doping profile of the first doping type in a second depth region of the active Hall effect region, wherein the second depth region is spaced form the surface of the semiconductor substrate,
wherein the first implantation energy level has a first implantation dose rate, and the second implantation energy level has a second implantation dose rate, wherein the first implantation dose rate is higher than second implantation dose rate.

14. The method according to embodiment 13, wherein the first and second implantation dose rates are chosen to provide the overall doping profile of the active Hall effect region having a doping concentration which increases from the surface of the semiconductor substrate up to the middle of the second depth region of the active Hall effect region and reaches, within a tolerance range, a maximum doping concentration of the first doping type in the middle of the second depth region and decreases from the middle of the second depth region up to a middle region between the first and second depth region, and which increases from the a middle region between the first and second depth region to the middle of the first depth region and reaches, within a tolerance range, the maximum doping concentration of the first doping type in the middle of the first depth region and decreases from the middle of the second depth region up to the isolation layer of the second doping type.

15. The method according to embodiment 1, comprising:
forming the first doping profile of the first doping type in the first depth region of the active Hall effect region up to an implanted isolation region in the semiconductor substrate, and
forming the second doping profile of the first doping type in a second depth region of the active Hall effect region adjacent to the surface of the semiconductor substrate;
wherein the first implantation energy level has a first implantation dose rate, and the second implantation energy level has a second implantation dose rate, wherein the first implantation dose rate is higher than second implantation dose rate.

16. The method according to embodiment 15, wherein the first and second implantation dose rates are chosen to provide the overall doping profile of the first doping type which has, within a tolerance range, a constant doping concentration of the first doping type from the surface of the semiconductor substrate to the middle of the second depth region and decreases from the middle of the second depth region up to a middle region between the first and second depth region to a local minimum of the doping concentration, and
wherein the resulting doping profile of the active Hall effect region has a doping concentration which increases from the middle region between the first and second depth region to the middle of the first depth region and reaches, within a tolerance range, the constant doping concentration of the first doping type in the middle of the first depth region and up to the implanted isolation layer of the second doping type.

17. The method according to any of the preceding embodiments, further comprising:
repeating the first implantation a plurality of times, and
repeating the second implantation a plurality of times.

18. The method according to any of embodiments 6 to 8, further comprising:
repeating the third implantation a plurality of times.

19. A Hall effect device, comprising:
an active Hall effect region, wherein the doped active region comprises a first doping profile of a first doping type in a first depth region, and a second doping profile of the first doping type in a second depth region of the active region.

20. The Hall effect device according to embodiment 19, wherein the active Hall effect region comprises a third doping profile of the first doping type in a third depth region, wherein the second doping profile partially superimposes the first doping profile, and wherein the third doping profile superimposes the second doping profile.

21. The Hall effect device according to embodiment 19 or 20, wherein the overall doping profile of the active Hall effect region has, within a tolerance range, a constant doping concentration of the first doping type in the depth direction from the surface of the semiconductor substrate into the semiconductor substrate up to the isolation layer of the second doping type.

22. The Hall effect device according to embodiment 19, wherein the overall doping profile of the active Hall effect region has, within a tolerance range, a constant doping concentration of the first doping type from the surface of the substrate through the second depth region to the middle of the first depth region and decreases from the middle of the first depth region up to the isolation layer of the second doping type.

23. The Hall effect device according to embodiment 19, wherein the overall doping profile of the active Hall effect region has a doping concentration which increases from the surface of the substrate up to the middle of the second depth region of the active Hall effect region and has, within a tolerance range, a constant doping concentration of the first doping type from the middle of the second depth region through the first depth region up to the isolation region of the second doping type in the semiconductor substrate.

24. The Hall effect device according to embodiment 19, wherein the overall doping profile of the active Hall effect region has a doping concentration which increases from the surface of the semiconductor substrate up to the middle of the second depth region of the active Hall effect region and reaches, within a tolerance range, a maximum doping concentration of the first doping type in the middle of the second depth region and decreases from the middle of the second depth region up to a middle region between the first and second depth region, and
wherein the resulting doping profile of the active Hall region has a doping concentration which increases from the a middle region between the first and second depth region to the middle of the first depth region and reaches, within a tolerance range, the maximum doping concentration of the first doping type in the middle of the first depth region and decreases from the middle of the second depth region up to the isolation layer of the second doping type.

25. A Hall effect device manufactured by the method according to any of embodiment 1 to 18.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for doping an active Hall effect region of a Hall effect device in a semiconductor substrate, the method comprising:
   forming a first doping profile of a first doping type in a first depth region of the active Hall effect region by means of a first implantation with a first implantation energy level;
   forming a second doping profile of the first doping type in a second depth region of the active Hall effect region by means of a second implantation with a second implantation energy level; and
   forming an overall doping profile of the active Hall effect region by annealing the semiconductor substrate with the active Hall effect region having the first and second doping profile,
   wherein the second doping profile partially superimposes the first doping profile.

2. The method according to claim 1, wherein the first implantation energy level and the second implantation energy level are different, and wherein the first implantation energy level has one of a first, second and third implantation dose rate, and wherein the second implantation energy level has one of the first, second and third implantation dose rate, wherein the first implantation dose rate is higher than the second implantation dose rate, and wherein the second implantation dose rate is higher than the third implantation dose rate.

3. The method according to claim 2, wherein the first implantation energy level is by a first factor of at least 1.5 higher than the second implantation energy level, and wherein the second energy implantation level is by a second factor of at least 1.5 higher than the third implantation energy level.

4. The method according to claim 1, the method further comprising:
   forming a doping profile of a second doping type in a third depth region in the semiconductor substrate below the active Hall effect region by means of a third implantation with a third implantation energy level, wherein the third depth region, having the doping profile of the second doping type, forms an isolation region below the active Hall effect region,
   wherein forming the doping profile of the second doping type is performed prior to forming the first and the second doping profile of the first doping type.

5. The method according to claim 1, comprising:
   forming the first doping profile of the first doping type in the first depth region of the active Hall effect region, wherein the first depth region extends to an isolation region in the semiconductor substrate;
   forming the second doping profile of the first doping type in the second depth region of the active Hall effect region, wherein the second doping profile partially superimposes at least the first doping profile;
   forming a third doping profile of the first doping type in a third depth region of the active Hall effect region, by means of a third implantation with a third implantation energy level, wherein the third doping profile partially superimposes at least the second doping profile, wherein the first depth region extends from a surface of the semiconductor substrate into the semiconductor substrate; and
   forming the overall doping profile of the active Hall effect region by annealing the active Hall effect region with the first, the second and the third doping profiles.

6. The method according to claim 5, wherein the first implantation energy level has a first implantation dose rate, wherein the second implantation energy level has a second implantation dose rate, and wherein the third implantation energy level has a third implantation dose rate,
   wherein the first implantation dose rate is higher than the second implantation dose rate, and wherein the second implantation dose rate is higher than the third implantation dose rate.

7. The method according to claim 6, wherein the first, the second and the third implantation dose rates are selected to provide the overall doping profile of the active Hall effect region having, within a tolerance range, a constant doping concentration of the first doping type in a depth direction from the surface of the semiconductor substrate into the semiconductor substrate up to the isolation region of the second doping type.

8. The method according to claim 1, comprising:
   forming the first doping profile of the first doping type in the first depth region of the active Hall effect region, wherein the first depth region extends to an isolation region in the semiconductor substrate; and
   forming the second doping profile of the first doping type in the second depth region of the active Hall effect region, wherein the second depth region is spaced from a surface of the semiconductor substrate,
   wherein the first implantation energy level has a first implantation dose rate, and the second implantation energy level has a second implantation dose rate, wherein the first implantation dose rate is higher than the second implantation dose rate.

9. The method according to claim 8, wherein the first and the second implantation dose rates are selected to provide the overall doping profile of the active Hall effect region having a doping concentration that increases from the surface of the substrate up to a middle portion of the second depth region of the active Hall effect region and has, within a tolerance range, a constant doping concentration of the first doping type from the middle portion of the second depth region through the first depth region up to the isolation region of the second doping type in the semiconductor substrate.

10. The method according to claim 1, comprising:
    forming the first doping profile of the first doping type in the first depth region of the active Hall effect region, wherein the first depth region is spaced from an isolation region in the semiconductor substrate; and
    forming the second doping profile of the first doping type in the second depth region of the active Hall effect region adjacent to a surface of the semiconductor substrate, wherein the second depth region extends from the surface of the semiconductor substrate into the semiconductor substrate;
    wherein the first implantation energy level has a first implantation dose rate, and the second implantation energy level has a second implantation dose rate, and wherein the first implantation dose rate is higher than the second implantation dose rate.

11. The method according to claim 10, wherein the first and the second implantation dose rates are selected to provide the overall doping profile of the active Hall effect region which has, within a tolerance range, a constant doping concentration of the first doping type from the surface of the substrate through the second depth region to a middle portion of the first depth region and decreases from the middle portion of the first depth region up to the isolation region of the second doping type.

12. The method according to claim 1, comprising:
forming the first doping profile of the first doping type in the first depth region of the active Hall effect region, wherein the first depth region is spaced from an isolation region in the semiconductor substrate; and
forming the second doping profile of the first doping type in the second depth region of the active Hall effect region, wherein the second depth region is spaced from a surface of the semiconductor substrate,
wherein the first implantation energy level has a first implantation dose rate, and the second implantation energy level has a second implantation dose rate, wherein the first implantation dose rate is higher than the second implantation dose rate.

13. The method according to claim 12, wherein the first and the second implantation dose rates are selected to provide the overall doping profile of the active Hall effect region having a doping concentration which increases from the surface of the semiconductor substrate up to a middle portion of the second depth region of the active Hall effect region and reaches, within a tolerance range, a maximum doping concentration of the first doping type in the middle portion of the second depth region and decreases from the middle portion of the second depth region up to a middle region between the first and the second depth region, and which increases from the middle region between the first and the second depth region to a middle portion of the first depth region and reaches, within a tolerance range, the maximum doping concentration of the first doping type in the middle portion of the first depth region and decreases from the middle portion of the second depth region up to the isolation region of the second doping type.

14. The method according to claim 1, comprising:
forming the first doping profile of the first doping type in the first depth region of the active Hall effect region up to an implanted isolation region in the semiconductor substrate; and
forming the second doping profile of the first doping type in the second depth region of the active Hall effect region adjacent to a surface of the semiconductor substrate,
wherein the first implantation energy level has a first implantation dose rate, and the second implantation energy level has a second implantation dose rate, wherein the first implantation dose rate is higher than the second implantation dose rate.

15. The method according to claim 14, wherein the first and the second implantation dose rates are selected to provide the overall doping profile of the active Hall effect region which has, within a tolerance range, a constant doping concentration of the first doping type from the surface of the semiconductor substrate to a middle portion of the second depth region and decreases from the middle portion of the second depth region up to a middle region between the first and second depth region to a local minimum of the doping concentration, and
wherein the overall doping profile of the active Hall effect region has a doping concentration which increases from the middle region between the first and the second depth region to a middle portion of the first depth region and reaches, within a tolerance range, the constant doping concentration of the first doping type in the middle portion of the first depth region and up to the implanted isolation region of the second doping type.

16. The method according to claim 1, further comprising:
repeating the first implantation a plurality of times; and
repeating the second implantation a plurality of times.

17. The method according to claim 5, further comprising:
repeating the third implantation a plurality of times.

18. A Hall effect device manufactured by a method for doping an active Hall effect region of a Hall effect device in a semiconductor substrate, the method comprising:
forming a first doping profile of a first doping type in a first depth region of the active Hall effect region by means of a first implantation with a first implantation energy level;
forming a second doping profile of the first doping type in a second depth region of the active Hall effect region by means of a second implantation with a second implantation energy level; and
forming an overall doping profile of the active Hall effect region by annealing the semiconductor substrate with the active Hall effect region having the first and second doping profile,
wherein the second doping profile partially superimposes the first doping profile.

19. The Hall effect device manufactured by the method according to claim 18, the method further comprising:
forming a doping profile of a second doping type in a third depth region in the semiconductor substrate below the active Hall effect region by means of a third implantation with a third implantation energy level, wherein the third depth region, having the doping profile of the second doping type, forms an isolation region below the active Hall effect region,
wherein forming the doping profile of the second doping type is performed prior to forming the first and the second doping profile of the first doping type.

20. The Hall effect device manufactured by the method according to claim 18, the method further comprising:
forming the first doping profile of the first doping type in the first depth region of the active Hall effect region, wherein the first depth region extends to an isolation region in the semiconductor substrate;
forming the second doping profile of the first doping type in the second depth region of the active Hall effect region, wherein the second doping profile partially superimposes at least the first doping profile;
forming a third doping profile of the first doping type in a third depth region of the active Hall effect region, by means of a third implantation with a third implantation energy level, wherein the third doping profile partially superimposes at least the second doping profile, wherein the first depth region extends from a surface of the semiconductor substrate into the semiconductor substrate; and
forming the overall doping profile of the active Hall effect region by annealing the active Hall effect region with the first, the second and the third doping profiles.

* * * * *